United States Patent [19]

Iida et al.

[11] Patent Number: 5,430,130
[45] Date of Patent: Jul. 4, 1995

[54] PHOTOSENSITIVE POLYFUNCTIONAL AROMATIC DIAZO COMPOUNDS USEFUL IN PHOTOSENSITIVE COMPOSITIONS

[75] Inventors: Hirotada Iida; Noriaki Tochizawa; Yasuo Kuniyoshi; Masaharu Watanabe; Katsuyo Tokuda; Ichiro Hozumi, all of Funabashi, Japan

[73] Assignee: Toyo Gosei Kogyo Co., Ltd., Japan

[21] Appl. No.: 95,743

[22] Filed: Jul. 21, 1993

[30] Foreign Application Priority Data

Jul. 24, 1992 [JP] Japan .................. 4-198512
Jun. 11, 1993 [JP] Japan .................. 5-140441

[51] Int. Cl.⁶ .............. C07C 245/20; G03C 1/54; G03F 7/016
[52] U.S. Cl. ............. 534/560; 534/558; 534/561; 534/562; 534/565; 430/146; 430/147; 430/157; 430/171; 430/172; 430/175; 430/302; 564/443
[58] Field of Search ............. 534/561, 558, 560, 563, 534/565

[56] References Cited

U.S. PATENT DOCUMENTS 5,206,344  4/1993  Iida et al. ................. 534/561

Primary Examiner—Floyd D. Higel
Attorney, Agent, or Firm—Jordan B. Bierman; Bierman and Muserlian

[57] ABSTRACT

An photosensitive polyfunctional aromatic diazo compound having at least two groups of Formula (uD) in the molecule, and a photosensitive composition using the same. The diazo compound can be handled under visible light free from ultraviolet, is highly photosensitive, has good shelf life, and is adequate as a photosensitive agent for lithographic printing plates and screen printing plates:

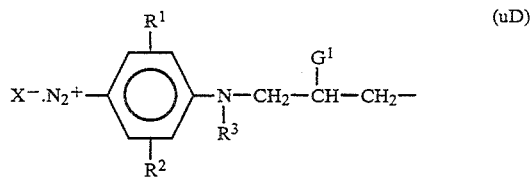

wherein $G^1$ is a substituent derived from alcoholic hydroxyl group;
$R^1$ and $R^2$ are hydrogen, or alkyl or alkyloxy of 1 to 8 carbon atoms;
$R^3$ is alkyl or substituted alkyl of 1 to 8 carbon atoms, aralkyl or substituted aralkyl of 7 to 14 carbon atoms, or —CH$_2$CHG$^2$—CH$_2$—;
$X^-$ is an anion based on protonic acid from which a proton is removed.

1 Claim, No Drawings

PHOTOSENSITIVE POLYFUNCTIONAL AROMATIC DIAZO COMPOUNDS USEFUL IN PHOTOSENSITIVE COMPOSITIONS

FIELD OF THE INVENTION

This invention relates to novel photosensitive polyfunctional aromatic diazo compounds which are high in photosensitivity, have good storage stability, and are easily synthesized, and photosensitive compositions using the same.

BACKGROUND OF THE INVENTION

Heretofore, as a typical photosensitive substance to be incorporated in photosensitive coating layers of photosensitive lithographic printing plates and photosensitive screen printing plates, a condensate (so-called diazo resin) of diphenylamine-4-diazonium salt (or 4-phenylamino-benzene-diazonium salt) and formaldehyde have been used. Production methods for such a polyfunctional diazo condensate are described in specifications of U.S. Pat. Nos. 2,679,498; 2,922,715; 2,946,683; 3,050,502; 3,311,605; 3,163,633; 3,406,159; and 3,277,074. These diazo condensates, although having many advantageous properties as practical photosensitive substances, have problems which have yet to be solved.

A first problem is that these diazo condensates are poorly soluble in organic solvents. This is especially true when inorganic ions such as halides, sulfates, or phosphates are used as counterions to the diazonium group of these diazo compounds and, when sulfonate ions such as benzenesulfonic acid, toluenesulfonic acid, or an alkylsulfonic acid are used, their solubility is insufficient in such organic solvents as glycol ethers, alcohols, ketones and the like. Such low solubility in organic solvents is a problem with these diazo condensates when used as photosensitive agents in photosensitive lithographic printing plates.

Various investigators have attempted to solve this problem. For example, Japanese Patent Publication 53-24449/1978 discloses the use of a special compound such as 2-hydroxy-4-methoxybenzophenone-5-sulfonic acid as a counterion to the diazonium group, which enhances the solubility in organic solvents.

Japanese Patent Publication 49-45323/1974 discloses the use of a special compound such as 4,4'-bismethoxymethyldiphenylether as a condensation agent for diphenylamine-4-diazonium salt in place of formaldehyde, which provides the same improvement. Furthermore, Japanese Patent Publication Laid-open 2-3049/1990 discloses the use of hexamethoxymethyl-melamine as a special condensation agent.

A second problem is that, since diazo condensate using diphenylamine-4-diazonium salt as a basic structural unit absorbs visible light in the region of 420–500 nm, it tends to decompose as a result. Thus, it is difficult to handle it under visible light even free from ultraviolet; this constitutes a disadvantage for production and use.

As a method which simultaneously solves the second and first problems, a novel polyfunctional diazo compound has been considered which basically differs in chemical structure from that of prior art diazo compounds. The thus obtained novel diazo compound comprises 4-dialkylaminobenzene-diazonium salt as a basic structural unit, in place of the conventional diphenylamine-4-diazonium salt.

For example, Japanese OPI (Patent Publication Laid-Open) 54-30121/1979 and Japanese OPI 61-273538/1986 use two or more 4-dialkylaminobenzene-diazonium salts, which are ester bonded to form a photosensitive polyfunctional diazonium salt. Further, Japanese OPI 1-57332/1989 uses 4-dialkylaminobenzene-diazonium salt, which is bonded in the form of a polyalkylamine to form a photosensitive polyfunctional diazonium salt. However, although these novel types of photosensitive polyfunctional diazo compounds have advantageous properties, their production is generally not easy. Furthermore, diazo compounds which are made polyfunctional by ester bonding in the above two OPI's have a problem in that the ester bond tends to be hydrolyzed.

A third problem is that diazo compounds used for photosensitive screen printing plates are essentially required to have a high solubility in water. In this respect, no diazo compounds have been reported which perform better than the prior art diazo compounds comprising a diphenylamine-4-diazonium salt condensed with formaldehyde. In Japanese OPI 2-11198/1990, diphenylamine-4-diazonium salt is condensed with formaldehyde to obtain highly water-soluble polyfunctional diazo compounds. However, these compounds have been developed to improve the developability of the lithographic printing plate after exposure with an alkaline aqueous solution, but do not provide an improvement for screen printing.

A fourth problem is that currently used condensates of diphenylamine-4-diazonium salt with formaldehyde are insufficient in photosensitivity, and a fifth problem is that the above condensates are low in transparency after exposure, or tend to be colored by heating after exposure. Such coloration has been a major problem in applications which require high transparency such as color proof and color filters, and its improvement has been in demand.

As described above, the prior art compounds have problems which have yet to be solved. Including a primary object of the present invention, these problems are summarized as follows:

1) Development of a photosensitive polyfunctional diazo compound which can be handled under visible light free from ultraviolet.
2) Development of a photosensitive polyfunctional diazo compound which, as a photosensitive agent for a lithographic printing plate, is high in solubility in appropriate organic solvents, and is easy to be developed with a developing solution mainly comprising an alkaline aqueous solution.
3) Development of a photosensitive polyfunctional diazo compound which is highly water soluble and suitable as a photosensitive agent for screen printing plate.
4) Development of a photosensitive polyfunctional diazo compound which is high in photosensitivity.
5) Development of a photosensitive polyfunctional diazo compound which is high in transparency after exposure and after exposure and heating.
6) Development of a photosensitive composition which effectively utilizes the properties of the thus obtained novel polyfunctional diazo compound(s).

The inventors have conducted intensive studies to solve these problems and achieved the invention described in the specification of U.S. Pat. No. 5,206,349.

The photosensitive polyfunctional diazo compound described in this invention has at least one group of Formula (A) in the molecule:

Formula (A)

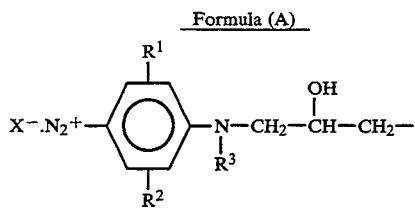

(A)

wherein $X^-$, $R^1$ and $R^2$ are the same as those used in the following Formula (I), and $R^3$ indicates a group which is the same as or similar to the same symbol in Formula (I).

With the invention described in the specification of U.S. Pat. No. 5,206,349, almost all of the above prior art problems have been solved, but it is found that improvement of the following properties would be even more desirable.

a) Improvement of water resistance and resolution of a coating film for a screen or color proof for screen printing obtained by using the diazo compound as a photosensitive substance.

b) When the diazo compound is used as a photosensitive substance for a lithographic printing plate, improvement of solubility of the diazo compound in solvents and of storage stability of the coating film on the resulting printing plate.

The inventors have been conducted further studies to improve above a) and b) and other properties, and have achieved the present invention.

SUMMARY OF THE INVENTION

In accordance with the present invention which attains the above object, there is provided a photosensitive aromatic diazo compound of Formula (I) or (II):

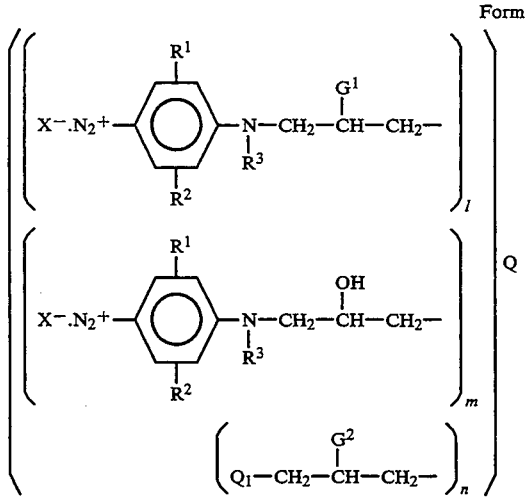

Formula (I)

wherein $l$, $m$, and $n$ are integers where $l=2$ to 10, $m=0$ to 5, $n=0$ to 5, and $l+m+n=2$ to 20.

$R^1$ and $R^2$ are independently hydrogen, or alkyl or alkyloxy having 1 to 8 carbon atoms;

$G^1$ is a substituent derived from alcoholic hydroxyl group;

$G^2$ is hydroxyl or the same group as $G^1$;

Q is a polyvalent group generated by reacting a compound having a reactivity to at least two oxiranes with carbon of the oxirane ring;

$Q^1$ is a monovalent, group generated by reacting a compound having a reactivity to oxirane with carbon of the oxirane ring;

$R^3$ is alkyl or substituted alkyl having 1 to 8 carbon atoms, aralkyl or substituted aralkyl having 7 to 14 carbon atoms, or $Q_1$—$CH_2CHG^2$—$CH_2$—;

$X^-$ is an anion based on protonic acid from which a proton is removed.

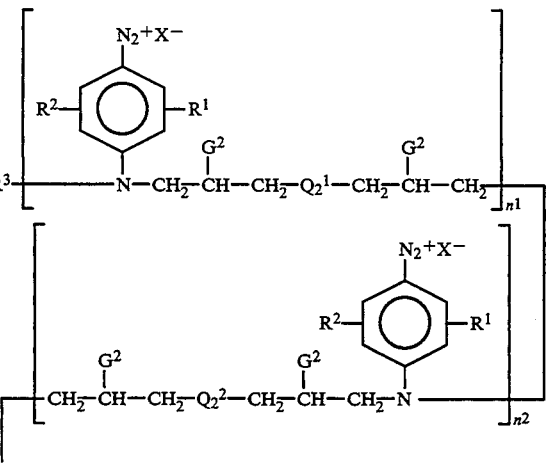

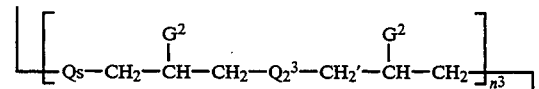

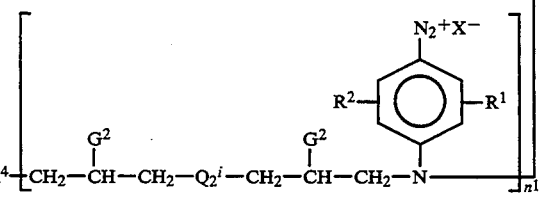

wherein $n^1$ to $n^i$ are integers from 0 to 10; $n^1+n^2+n^3+ \ldots +n^i=2$ to 20; $R^1$, $R^2$, $R^3$ and $X^-$ are respectively the same as those in Formula (I);

$G^2$ is hydroxyl or the same group as $G^1$ in Formula (I), and the number of hydroxyl groups represented by $G^2$ in one molecule of a diazo compound of Formula (II) is 0 to 10, and the number of groups which are the same as $G^1$ is 2 to 20;

$Q_2^1$ to $Q_2^i$ and $Q_s$ are the same or different groups, and are divalent groups generated by reacting a compound in which one molecule is reactable with the carbons of two oxirane rings;

$R^4$ is the same as $Q_1$ or $G^2$ in Formula (I), or Formula (III).

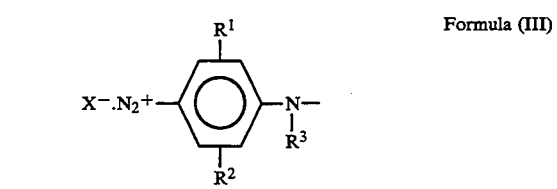

Formula (III)

wherein $X^-$, $R^1$, $R^2$, and $R^3$ are the same as in Formula (I).

Practical examples of $X^-$ in Formula (I) or Formula (II) are: $Cl^-$, $Br^-$, $HSO_4^-$, $\frac{1}{2} SO_4^{2-}$, $H_2 PO_4^-$, $\frac{1}{2} HPO_4^{2-}$, $HSO_3^-$, $Cl-\frac{1}{2} ZnCl_2$, $Br-\frac{1}{2} ZnCl_2$, $BF_4^-$, $PF_6^-$, benzenesulfonate, toluenesulfonate, dodecylbenzenesulfonate, mesitylenesulfonate, naphthalenesulfonate, naphthalenedisulfonate, 2-hydroxy-4-methoxybenzophenone-5-sulfonate, and methanesulfonate.

$R^1$ and $R^2$ in Formula (I) or Formula (II) are independently hydrogen, alkyl or alkyloxy having 1 to 8 carbon atoms, of which hydrogen, methyl, ethyl, methoxy, and ethoxy are preferable.

Practical examples of $G^1$ in Formula (I) are hydrogen, chlorine, bromine, methoxy, ethoxy, propoxy, butoxy, octyloxy, benzyloxy, phenethyloxy, methylbenzyloxy, hydroxyethyloxy, 2-hydroxypropyloxy, phenylhydroxyethyloxy, 3-methoxy-2-hydroxypropyloxy, 3-phenoxy-2-hydroxypropyloxy, carboxymethyloxy, carboxyethyloxy, carboxypropyloxy, methoxymethyloxy, 2-tetrahydropyranyloxy, allyloxy, crotyloxy, sulfomethyloxy, sulfoethyloxy, sulfopropyloxy, acetoxy, propionyloxy, butyryloxy, hexanoyloxy, acryloyloxy, methacryloyloxy, chloroacetyloxy, oxaloxy, carboxyethylcarbonyloxy, carboxypropylcarbonyloxy, carboxyphenylcarbonyloxy, N-phenylcarbamoyloxy, 2-chloroethyloxy, 2-chloropropyloxy, 2-phenyl-2-chloroethyloxy, 3-methoxy-2-chloropropyloxy, 2-phenoxy-2-chloropropyloxy, 2-acetoxyethyloxy, 2-carboxyethylcarbonyloxyethyl, 3-methoxy-2-acetoxypropyloxy, and 3-phenoxy-2-acetoxypropyloxy.

$G^2$ in Formula (I) or Formula (II) denotes hydroxyl group or $G^1$.

Q in Formula (I) denotes a polyvalent group generated by reacting a compound shown below having a reactivity with carbons of two or more oxirane rings. The compound reactive with two or more oxirane rings is preferably a compound having one or more primary amino groups, two or more secondary amino groups, hydroxy or mercapto groups, or generates two or more carboanions, or a compound having two or more of these groups.

Practical examples of these compounds include: ammonia, primary alkylamines having 1 to 20 carbon atoms, primary aralkylamines having 7 to 20 carbon atoms, polyamines having 4 to 30 carbon atoms and having two or more secondary amino groups in the molecule, dihalogenoaniline, trihalogenoaniline, trialkylaniline, diaminodiphenylsulfone, aniline-formaldehyde condensate, ethanolamine, diethanolamine, glycine, β-alanine, 6-aminohexanoic acid, p-aminobenzoic acid, anthranilic acid, sulfanilic acid, taurine, ethylenediamine, xylylenediamine, ethyleneurea, hydantoin, isocyanuric acid; ethylene glycol, propylene glycol, butylene glycol, xylylene glycol, glycerin, sorbitol, sorbitan, pentaerythritol, tris(2-hydroxyethyl) isocyanurate; 4,4'-dihydroxydiphenylmethane and its homologues, bisphenol A, tetrabromobisphenol A and other bisphenol A homologues, bis(4-hydroxyphenyl)acetic acid, 2,2-bis(4-hydroxyphenyl)propionic acid, 4,4'-dihydroxydiphenylether and its homologues, 4,4'-dihydroxydiphenylsulfone and its homologues, phenolformaldehyde condensate, cresol-formaldehyde condensate, catechol, resorcinol, hydroquinone, pyrogallol, gallic acid, dihydroxynaphthalene; dimercaptoalkanes having 2 to 18 carbon atoms, dimercaptoaralkanes having 8 to 20 carbon atoms, dimercaptoethers having 4 to 20 carbon atoms, dimercaptobenzene, dimercaptotoluene, dimercaptoheterocyclic compounds; dialkyl malonate, N,N'-diacetoacetylalkylenediamine, N,N'-diacetoacetylarylenediamine, N,N'-diacetoacetylaralkylenediamine; diethylene triamine, triethylenetetramine, aminophenol, hydroxythiophenol, aminothiophenol, and N-acetoacetylthiophenol.

$Q_1$ of Formula (I) denotes a monovalent group generated by reacting the following compound having a reactivity to one oxirane ring with carbon of one oxirane ring. The compound having a reactivity to one oxirane ring is preferably a compound having one secondary amino, hydroxyl, or mercapto or carboanion generating group in the molecule, and some oxoacids and hydrohalogenic acids are also preferable.

Practical examples of these compounds include: secondary amines having 2 to 30 carbon atoms having one or two different alkyl, aralkyl, or aryl, secondary amines having carboxy, sulfo, or sulfamoyl such as N-methyltaurine, N-methylanthranilic acid, and N-ethylsulfanilic acid; alkyl alcohols having 1 to 20 carbon atoms, aralkyl alcohols having 7 to 30 carbon atoms, phenol and its homologues, phenol compounds having carboxy, sulfo, or sulfamoyl groups, such as p-hydroxybenzoic acid, salicylic acid, and hydroxybenzene-sulfonic acid; carboxylic acids having a mercapto group such as alkyl or aralkylmercaptans having 1 to 30 carbon atoms, thiophenol and its homologues, heterocyclic compounds having one mercapto group, mercaptoacetic acid, mercaptopropionic acid, mercaptosuccinic acid, mercaptobenzoic acid; cyano ion, alkyl cyanoacetate, dialkyl esters of alkylmalonic acid, acetoacetylarylamide; hydrogen halide, phosphonic acid, phosphinic acid, and thiosulfate ion.

$Q_2^i$ to $Q_2^i$ and $Q_s$ of Formula (II) denote divalent groups generated by the reaction of compounds having a reactivity to two oxirane rings with such rings. The compounds reactable with two oxirane rings are preferably those which have one primary amino group, two secondary amino, hydroxyl, or mercapto groups, or carboanion generating groups, or those having two of these groups.

Practical examples of these compounds include: primary alkylamines having 1 to 20 carbon atoms, aralkylamines having 7 to 20 carbon atoms, dihalogenoaniline, trihalogenoaniline, trialkylaniline, ethanolamine, glycine, β-alanine, 6-aminohexanoic acid, p-aminobenzoic acid, anthranilic acid, sulfanilic acid, taurine, ethyleneurea, hydantoin, alkylene glycol, aralkylene glycol; 4,4'-dihydroxydiphenylmethane and its homologues, bis(4-hydroxyphenyl)acetic acid, 2,2-bis(4-hydroxyphenyl)propionic acid, bisphenol A, tetrabromobisphenol A and other bisphenol homologues, 4,4'-dihydroxydiphenyl ether and its homologues, 4,4'-dihydroxydiphenyl sulfone and its homologues, catechol, resorcinol, hydroquinone, dihydroxynaphthalene; dimercaptoalkane having 2 to 18 carbon atoms, dimercaptoaralkane having 8 to 20 carbon atoms, dimercaptoether having 4 to 20 carbon atoms, dimercaptobenzene, dimercaptotoluene, dimercaptoheterocyclic compounds; dialkyl malonate, N,N'-diacetoacetylalkylenediamine, N,N'-diacetoacetylarylenediamine, N,N'-diacetoacetylaralkylenediamine; N-alkylaminophenol, hydroxythiophenol, N-alkylaminothiophenol, and N-acetoacetylaminothiophenol.

$R^3$ of Formula (I) or Formula (II) denotes alkyl or substituted alkyl having 1 to 8 carbon atoms, aralkyl or substituted aralkyl having 7 to 14 carbon atoms, or $Q_1$—$CH_2CHG^2$—$CH_2$ of Formula (I).

$R^4$ of Formula (II) has the same meaning as $Q_1$ or $G^2$ of Formula (I) or a group of Formula (III):

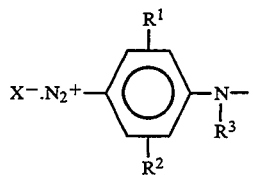

wherein $X^-$, $R^1$, $R^2$, and $R^3$ denote the same groups as those in Formula (I) or Formula (II).

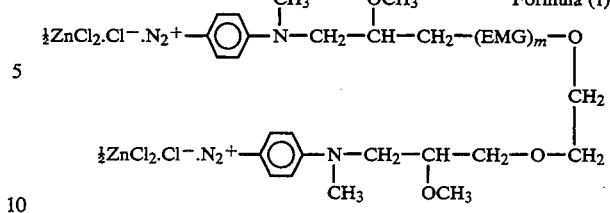

wherein EMG denotes a divalent group generated by methylation of a lower condensate of ethylene glycol and epichlorohydrin; and m is an integer from 0 to 2.

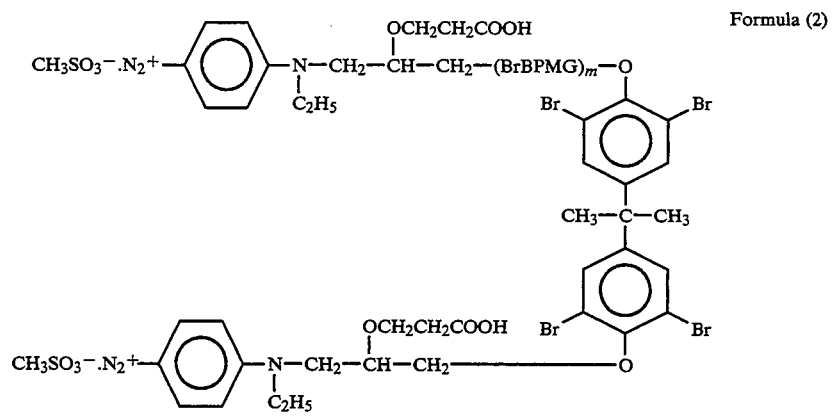

wherein BrBEMG denotes a divalent group generated by carboxyethylation of OH of a lower condensate of tetrabromobisphenol A and epichlorohydrin; and m is an integer from 0 to 2.

DETAILED DESCRIPTION OF THE INVENTION

The novel photosensitive polyfunctional aromatic diazo compound obtained in the present invention will now be described further in detail.

Formulae (1) to (11) are the main ingredients of practical examples of the novel photosensitive polyfunctional aromatic diazo compound according to the present invention and are shown below, but the present invention is not limited to the examples. Formulae (1), (2), (3), (4), (5), (6), (7), (10) and (11) are examples corresponding to Formula (I), and Formulae (8) and (9) are examples corresponding to Formula (II).

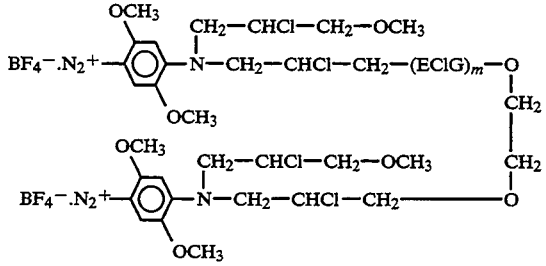

wherein ECIG denotes a divalent group generated by Cl— substitution of OH of a lower condensate of ethylene glycol and epichlorohydrin; and m is an integer from 0 to 2.

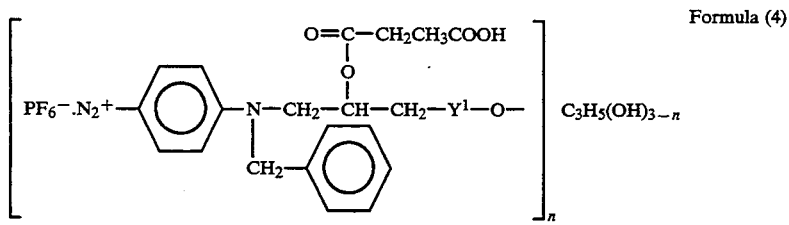

wherein n is 2 or 3; $C_3H_5(OH)_3$ denotes glycerin; and $Y^1$ does not exist or denotes a divalent group generated by reaction of succinic anhydride with a lower condensate of glycerin and epichlorohydrin.

Formula (5)

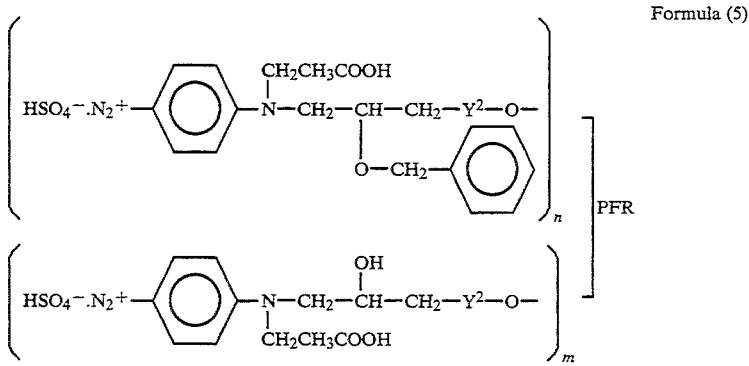

wherein n is an integer from 1 to 10; m is an integer from 0 to 10; n+m is up to 15; PFR denotes a group of condensate molecule of phenol and formaldehyde, with (n+m) units of phenolic OH groups removed; $Y^2$ does not exist or denotes a divalent group generated by benzylation of a lower condensate of epichlorohydrin and phenol-formaldehyde condensate molecule.

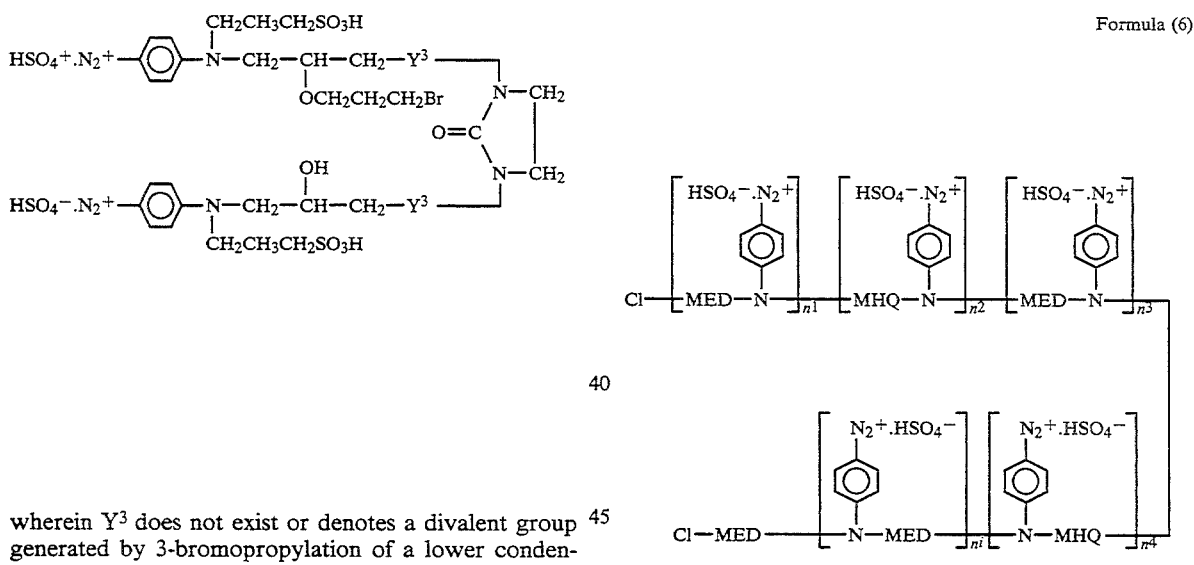

wherein $Y^3$ does not exist or denotes a divalent group generated by 3-bromopropylation of a lower condensate of epichlorohydrin and ethyleneurea.

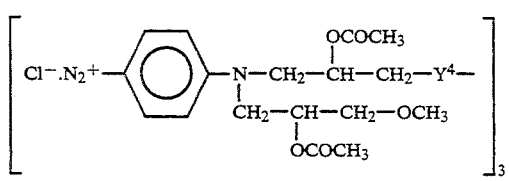

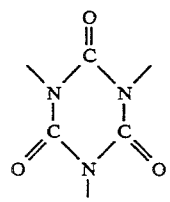

wherein $Y^4$ does not exist or denotes a divalent group generated by acetylation of a lower condensate of epichlorohydrin and isocyanuric acid.

Formula (8)

Formula (6)

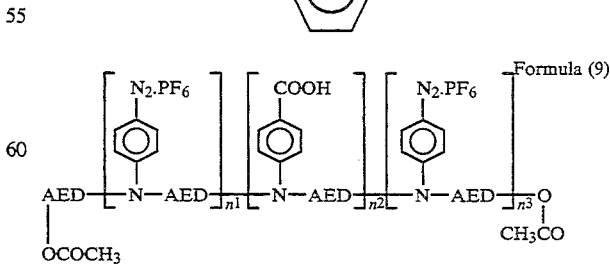

wherein $n^1$ to $n^i$ are integers from 0 to 4, and $n^1 + n^2 + \ldots n^i = 2$ to 20; MED denotes the group ($-CH_2CHClCH_2-)_2-OCH_2CH_2O-$, and MHQ denotes the group $(-CH_2CHClCH_2)_2 O- \bigcirc -O-$ Formula (9)

wherein $n^1 + n^2$ is about 4, n2 is about 2, and AED denotes the group $(-CH_2CH(OCOCH_3)CH_2-)_2-OCH_2CH_2O-$.

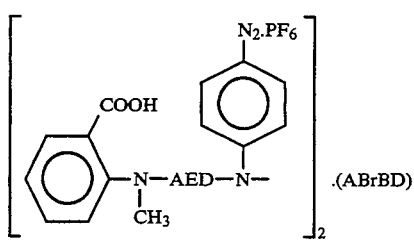

Formula (10)

wherein AED has the same meaning as that in Formula (9); and ABrBD denotes a divalent group generated by reacting tetrabromobisphenol-A-diglycidylether with amine followed by acetylation.

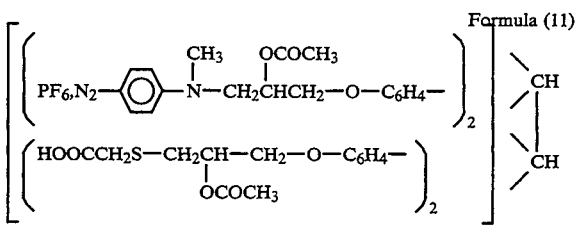

Formula (11)

Next, the synthesis of the novel photosensitive polyfunctional aromatic diazo compounds of the present invention will now be described. These novel photosensitive polyfunctional aromatic diazo compounds can be synthesized on the basis of the synthetic method of a compound having at least two groups of Formula (A) in the molecule described in the specification of U.S. Pat. No. 5,206,349 by the inventors herein.

The synthesis of the novel photosensitive polyfunctional aromatic diazo compound of Formula (I) or (II) is as follows:

A first synthetic method starts from a diazo compound having at least two groups of Formula (A) in the molecule described in the specification of U.S. Pat. No. 5,206,349, with all or part of the OH groups converted to $-G^1$.

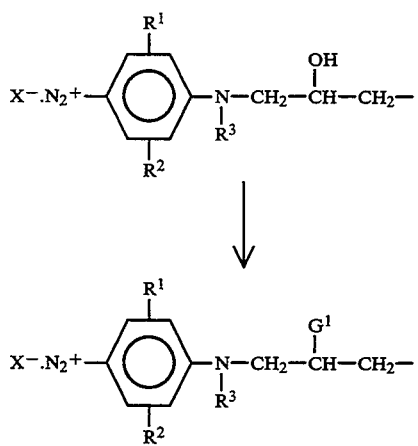

The synthetic method can be applied to a case where the diazo compound having at least two groups of Formula (A) is soluble in an organic solvent not containing a hydroxyl group.

Specifically, this method is effective for a case where the counterion $X^-$ of the diazonium group of Formula (A) is $Cl^-$, $PF_6^-$, $BF_4^-$, arylsulfonate ion, alkylsulfonate ion, or the like. Compounds of Formulae (4), (7), (9), (10) and (11) are practical examples synthesized by this method. The compound of Formula (4) was synthesized by reacting a diazo compound containing an OH group with succinic anhydride as the starting material in the presence of an acid catalyst. The compounds of Formulae (7), (9), (10) and (11) were synthesized by reacting a diazo compound containing an OH with acetic anhydride as the starting material in the presence of an acid catalyst.

In a second synthetic method, the OH group contained in an intermediate material of the diazo compound described in the specification of U.S. Pat. No. 5,206,349 was first converted to $G^1$, and then into a diazo compound. Since the intermediate material contains two or more groups of Formula (AACNH) or Formula (AH) in the molecule, all or part of the OH groups are converted to $G^1$, and then converted into the diazo compound of the present invention through the chemical reaction as shown below:

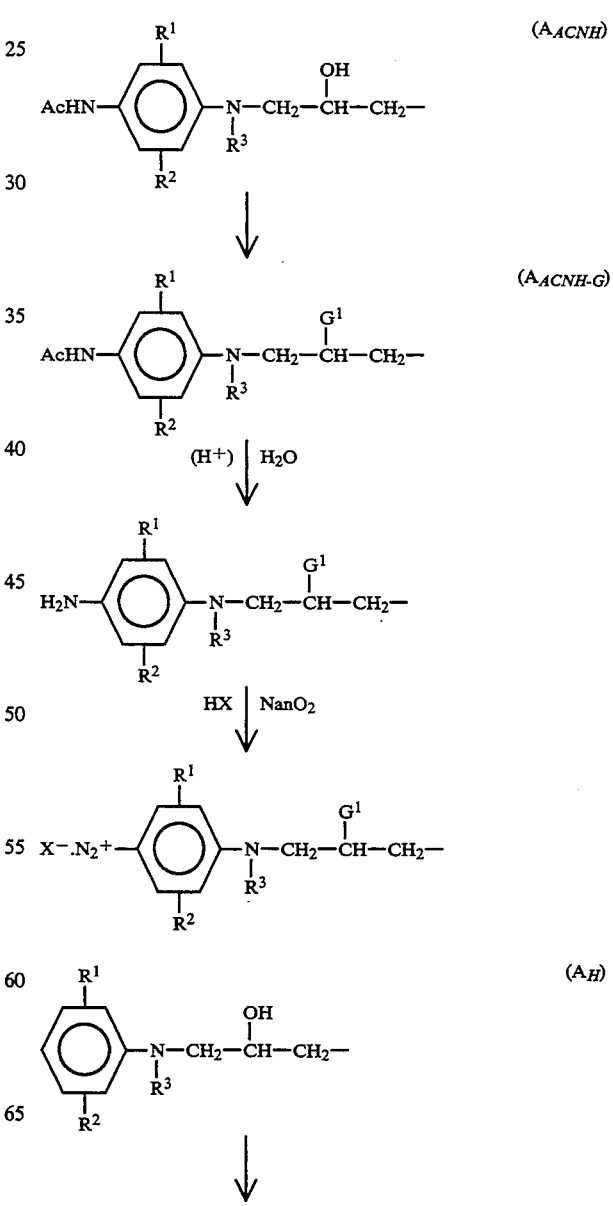

-continued

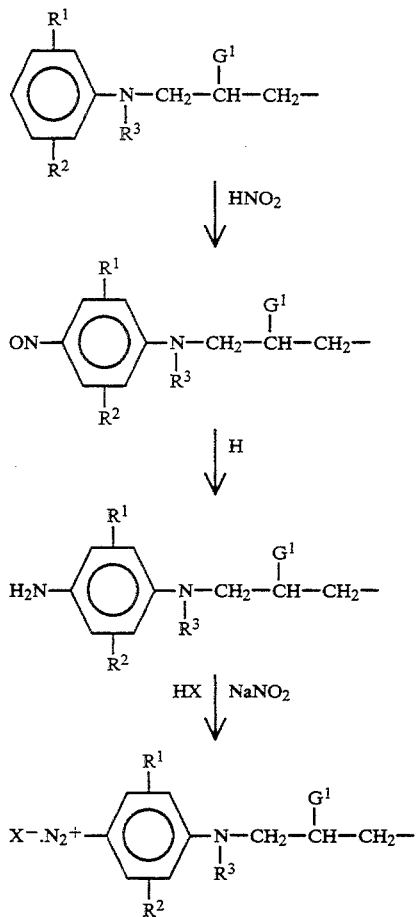

Since the OH groups of Formulae (AACNH) and (AH) are converted to G¹, and then derived into a diazo compound through the above chemical react, ion, the G¹ group must be stable in these chemical reactions. For this reason, it is normally best to etherify the OH group. The compounds of Formulae (1), (2), (5), and (6) are practical examples synthesized by this method.

Furthermore, the OH group of Formulae (AACNH) and (AH) can be easily substituted with chlorine or bromine by a halogenating agent such as phosphorus pentachloride, phosphorus trichloride, thionyl chloride, or phosphorus tribromide. The compounds of Formulae (3) and (8) are examples in which the OH is substituted with chlorine by the reaction, and then converted to a diazo compound. Since, after the OH group of Formula (AACNH) or (AH) is substituted with chlorine or bromine, the product, can be reduced with zinc and an acid or sodium boron hydride to obtain an intermediate material wherein the OH group is substituted by H, the result can be converted into a desired diazo compound.

The properties of the photosensitive polyfunctional aromatic diazo compounds of the present invention will now be described. Since the diazo compounds of the present invention are based on the aromatic diazo compounds described in the specification of U.S. Pat. No. 5,206,349, both of the diazo compounds have the following advantageous properties:

1) High photosensitivity,
2) High storage stability,
3) Maximum absorption wavelengths due to 4-(N,N-dialkyl amino)benzenediazonium, in the range from 372 to 382 nm (depending on the type of solvent), but almost no absorption in the visible light region. Therefore, they can be handled under white light.
4) Nearly colorless photodecomposition products.

With the above-described advantageous properties, the aromatic diazo compounds of the present invention can improve the performance of the aromatic diazo compounds described in the specification of U.S. Pat. No. 5,206,349 as follows:

1) By selecting a hydrophobic group such as chlorine, alkyloxy, or aralkyloxy as the substituent G¹ of Formula (I), the water resistance of the printing plate (for example, screen printing plate) obtained using the polyfunctional diazo compound can be improved. The compound of Formula (1) is a practical example of this kind.

2) By selecting a hydrophilic group such as carboxyalkyloxy or carboxyalkylcarbonyloxy as the substituent G¹ of Formula (I), the developability with a developing solution mainly comprising water of the printing plate obtained using the polyfunctional diazo compound can be enhanced. From this point of view, the diazo compounds of Formulae (2) and (4) are suitable as diazo compounds for lithographic printing plates.

A photosensitive composition using the novel photosensitive polyfunctional aromatic diazo compound of the present invention will now be described in detail. As described above, the novel photosensitive polyfunctional aromatic diazo compounds mainly comprising the compound of Formula (I) or Formula (II) obtained by the present invention have superior properties as photosensitive agents. Therefore, various novel high-performance photosensitive compositions can be obtained by using the novel aromatic diazo compounds as photosensitive agents.

Among such compositions, photosensitive materials for photosensitive lithographic printing plates, photosensitive screen printing plates, and colored image formation materials are particularly superior in performance. However, the present invention is not limited to the detailed examples which follow.

The present invention, which uses the novel aromatic diazo compound, allows production of a photosensitive lithographic printing plate with improved properties. For example, in the production of a lithographic printing plate, the diazo compound according to the present invention can be used in combination with various natural or synthetic resins. These resins must be sufficiently ink-receptive, soluble in ordinary organic solvents, compatible with the aromatic diazo compounds according to the present invention, and have film-forming properties, as well as abrasion resistance and adequate elasticity.

Suitable resins include cresol resins, polyesters, polyamides, polyurethanes, polyvinyl chlorides, polyalkylmethacrylates, polystyrenes, and polyvinyl acetates; and copolymers of polymerizable monomers selected from acrylates such as methyl acrylate, ethyl acrylate, 2-hydroxyethyl acrylate, alkylmethacrylates, acrylamides such as acrylamide and N-ethylacrylamide, vinylethers, vinylesters, and styrenes.

Depending on the type of substrates and application purposes, the content of the photosensitive diazo compound in the inventive photosensitive composition is preferably 1 to 50% by weight, more preferably 3 to 20% by weight.

In addition to the above-described ingredients, the photosensitive composition according to the present invention can be mixed with dyes, pigments, coating improvers, and plasticizers as necessary. The above-described photosensitive composition can be coated on the surface of the substrate and dried to obtain a photosensitive lithographic printing plate.

As the substrates, sheets of paper, plastic, or aluminum, which are suitable for use in the lithographic printing plate, are used. The coating solvents include cellosolves, such as methylcellosolve, 1-methoxy-2-propanol, methylcellosolve acetate, ethylcellosolve, and ethylcellosolve acetate; dimethylformamide; dimethylsulfoxide; dioxane; acetone; cyclohexanone; and methyl ethyl ketone. These solvents can be used alone or as a mixture.

The composition can be coated by a conventional method known in the art, for example, by rotary coating, wire bar coating, dip coating, air knife coating, roll coating, blade coating, or curtain coating. The composition is preferably coated in an amount of 0.2 to 10 g/m² of solid.

In the present invention, it is preferable that, the aluminum plate forming the photosensitive composition layer on top be grained and anodized, and the pores formed by anodized oxidation be sealed.

The thus treated aluminum substrate can be coated with the photosensitive composition to obtain a photosensitive printing plate. In particular, the use of the substrate results in improved storage stability and adhesion of the photosensitive composition layer, and gives sharp images after exposure and development to obtain a sharp printed image throughout an extremely long printing process.

The thus obtained photosensitive lithographic printing plates can be used by conventional methods known in the art. Typically, the photosensitive printing plate is closely contacted with a negative film, exposed, and developed with a weak alkaline aqueous solution containing a small quantity of organic solvent. The lithographic printing plate can be used on a sheet-fed or webbed offset printing presses.

Thus, the photosensitive printing plate is exposed through a transparent original picture having line images or dot images, and developed with an aqueous developing solution to obtain a negative image corresponding to the original picture. Light sources suitable for exposure include an ultra-high pressure mercury lamp, a carbon arc lamp, a xenon lamp, a metal halide lamp, and a stroboscopic lamp.

The solution used for developing the photosensitive lithographic printing plate according to the present invention can be any of the known developing solutions, preferably containing a specific organic solvent, an alkaline agent, and water as essential ingredients. The specific organic solvent is one which, when present in the developing solution, can dissolve or swell unexposed (non-image) portions of the photosensitive composition, and has a solubility of no more than 10% by weight in water at room temperature (20° C.). Any organic solvent having the above properties may be used. Such organic solvents include, but are not limited to, carboxylic acid esters such as ethyl acetate, propyl acetate, butyl acetate, amyl acetate, benzyl acetate, ethylene glycol monoacetate, butyl lactate, and butyl levulinate; ketones such as ethyl butyl ketone, methyl isobutyl ketone, and cyclohexanone; alcohols such as ethylene glycol monobutyl ether, ethylene glycol benzyl ether, ethylene glycol monophenyl ether, benzyl alcohol, methyl phenyl carbinol, and n-amyl alcohol; alkyl-substituted aromatic hydrocarbons such as xylene; and halogenated hydrocarbons such as methylene dichloride, ethylene dichloride, and monochlorobenzene. Among these organic solvents, ethylene glycol monophenyl ether and benzyl alcohol are particularly effective. These organic solvents are included in the developing solution normally in an amount of 1 to 20% by weight, preferably 2 to 10% by weight.

The alkaline agents used in the developing solution include:

(A) inorganic alkaline agents such as sodium silicate, potassium silicate, potassium hydroxide, sodium hydroxide, lithium hydroxide, sodium phosphate, ammonium phosphate, hydrogen phosphate, sodium metasilicate, sodium carbonate, and ammonia;

(B) organic compounds such as mono-, di, or triethylamine, mono- or diisopropylamine, n-butylamine, mono-, di-, or triethanolamine, mono-, di-, or triisopropanolamine, and ethylenediamine.

Among these alkaline agents, (A) potassium silicate and sodium silicate, and (B) organic amines are preferable, and (A) sodium silicate and (B) di- or tri-ethanolamine are particularly preferable. These alkaline agents are present in the developing solution in an amount of 0.05 to 8% by weight.

Furthermore, in order to improve the storage stability and printing resistance, it is preferable to add a water-soluble sulfite salt to the developing solution. Suitable water-soluble sulfite salts include sodium sulfite, potassium sulfite, lithium sulfite, and magnesium sulfite. These sulfite salts are present in the developing solution composition normally in an amount of 0.05 to 4% by weight, preferably 0.1 to 1% by weight.

To facilitate dissolution of the organic solvent in water, a solubilizing agent can be added. As such a solubilizing agent, low molecular weight alcohols or ketones can be used. An anionic surfactant or an amphoteric surfactant can also be used. As the surfactant, sodium isopropylnaphthalene-sulfonate, sodium n-butylnaphthalene-sulfonate, sodium N-methyl-N-pentadecylaminoacetate, and sodium laurylsulfate are preferable. The amounts of these alcohols or ketones are not specifically limited, but are preferably no more than 30% by weight of the developing solution.

The photosensitive composition according to the present invention is highly photosensitive and highly printing resistant, and can be rapidly developed with a weak aqueous alkaline solution. Furthermore, it can be easily developed since it has a wide range of optimum developing conditions (developing latitude).

Another embodiment of the photosensitive composition according to the present invention is a photosensitive material for screen printing plates. When the inventive photosensitive composition is used as a photosensitive material for screen printing plates, the composition preferably comprises the inventive diazo compound, partially-hydrolyzed polyvinylacetate, and a hydrophobic polymer emulsion. The partially-hydrolyzed polyvinylacetate preferably has a hydrolysis degree of at least 70 mole % and a polymerization degree of 300 to 3000.

The partially-hydrolyzed polyvinylacetate can be partially bonded with an acetal of an aldehyde such as formaldehyde, acetaldehyde, butyraldehyde, or p-benzaldehydesulfonic acid, and/or an acetal of a photosensitive group such as styrylpyridinium.

The hydrophobic emulsion can be polyvinylacetate emulsion, vinylacetate/ethylene copolymer emulsion, vinylacetate/acrylic ester copolymer emulsion, styrene/butadiene copolymer emulsion, methylmethacrylate/butadiene copolymer emulsion, acrylonitrile/butadiene copolymer emulsion, polychloroprene emulsion, polyisoprene emulsion, polymethacrylic acid emulsion, polyvinylchloride emulsion, polyvinylidenechloride emulsion, polystyrene emulsion, silicone resin emulsion, polyethylene emulsion, polyurethane emulsion, or fluororesin emulsion.

The inventive photosensitive composition used for the screen printing plate basically comprises the above ingredients, but known additives such as photoreactive unsaturated compounds, photopolymerization initiators, emulsion stabilizers, dyes, and pigments can also be added.

The above composition is coated on a screen mesh comprising a synthetic resin such as polyester, nylon, or polyethylene, the synthetic resin being deposited with a metal such as nickel or stainless steel, and then dried. This procedure can be repeated to obtain a screen printing plate; or the composition is coated on a peelable film such as polyethylene, polyvinylchloride, or polyester, dried to obtain a coating film, and transferred to a screen mesh coated with water or the inventive photosensitive composition (so-called a direct method) to obtain a screen printing plate. Alternatively, the inventive composition is processed into a printing plate on a peelable film, and then transferred to a screen (indirect method) to obtain a screen printing plate. Since the inventive photosensitive composition becomes transparent on exposure, it can be used to good advantage particularly for thick-film screen printing plates.

Another embodiment of the photosensitive composition according to the present invention is a colored image formation material. A colored image can be obtained by method (1) in which a photosensitive composition comprising the inventive photosensitive polyfunctional aromatic diazo compound and a dyeable binder resin is coated on a substrate, exposed through a photomask, and developed to obtain a relief pattern; the relief pattern is then dyed to obtain a colored image. In method (2), a colored photosensitive composition comprising the inventive photosensitive polyfunctional aromatic diazo compound, a binder resin, and a dye or pigment is coated on a substrate, exposed through a photomask, and developed to form a colored image.

With the diazo compounds according to the present invention, as compared to a prior art condensate of diphenylamine-4-diazonium salt with formaldehyde, transparency in the visible region after exposure is high. This difference is even further increased by heating after exposure. The colored image formed using the inventive photosensitive composition provides an image having a pure tint specific to the coloring agent.

The transparent substrate used in the present invention includes those films of polyethylene terephthalate, polypropylene, polyethylene, polyvinylchloride, polystyrene, polycarbonate, cellulose triacetate, glass, a silicon wafer, paper, and the like.

DESCRIPTION OF THE PREFERRED EMBODIMENTS

While the invention will now be described in connection with certain preferred embodiments in the following examples, they are illustrative only and do not limit the invention.

Examples 1 to 6 are synthesis examples of the photosensitive polyfunctional aromatic diazo compounds according to the present invention. Examples 7 to 11 show photosensitive compositions using the inventive aromatic diazo compounds.

Example 1

Synthesis of Photosensitive Polyfunctional Aromatic Diazo Compound of Formula (1)

N-methylaniline, 21.4 g (0.2 mole), 25.3 g of ethyleneglycoldiglycidylether, 80 g of benzene, and 20 g of N,N-dimethylacetamide were introduced into a flask provided with a reflux condenser and a Dean-Stark trap.

The reaction mixture was heated to the boiling point of benzene during the course of 2 hours, and benzene was refluxed for 8 hours to react the N-methylaniline and the ethyleneglycoldiglycidyl-ether and remove the water contained in the reagents used. The reaction mixture was cooled to approximately 10°, nitrogen was passed into the flask, and 0.3 mole of sodium hydride was added little by little at 10° to 15° C. Dimethylsulfate, 31.5 g (0.25 mole), was dropped thereon at 10° to 15° C. over a period of about one hour, and further stirred at 25° to 30° C. for 4 hours. 100 g of a 10% aqueous sodium carbonate solution was introduced, and stirred at 60° C. for 2 hours. The benzene layer was separated, the water layer was extracted with 50 g of benzene, both benzene solutions were combined, dehydrated with magnesium sulfate powder, and the benzene was distilled out to obtain 45 g of an oily substance. The resulting oily substance was identified infrared absorption and NMR spectra to be an N-substituted compound of N-methylaniline corresponding to Formula (AH-G) where $G^1$ is methoxy.

The methoxy compound was dissolved by heating in 130 g of acetic acid, mixed with 130 g of 20% hydrochloric acid, cooled to 5° C., a solution of 14.5 g (0.21 mole) of sodium nitrite in 40 g of water was slowly dropped at the same temperature over 30 minutes to form a nitroso compound. The reaction mixture was mixed with 120 g of 90% lactic acid, and further with 140 g of 35% hydrochloric acid, while being maintained at 35° to 40° C. by external cooling, 33 g of zinc powder was slowly added to reduce the nitroso compound resulting in a colorless transparent solution.

The solution was mixed with 5 g of activated charcoal and vigorously agitated, filtered, cooled to 5° C., and a solution of 14.5 g (0.21 mole) of sodium nitrite in 40 g of water was slowly dropped into the mixture at the same temperature. After the dropping, the mixture was stirred for a further hour to complete diazotization. The resulting solution was slowly added to 4 liters of isopropylalcohol cooled to 0° C. under effective stirring, the precipitated zinc chloride salt of the diazonium salt was filtered, washed twice in isopropylalcohol and once in isopropylether, and vacuum dried. The yield was 40 g. The aqueous solution of the diazo compound had a $\lambda_{max}$ in the near-ultraviolet absorption spectrum of 376 nm, and an absorption coefficient of 83.2, wherein the concentration is in g/liter and the optical path length in cm.

Example 2

Synthesis of Photosensitive Polyfunctional Aromatic Diazo Compound of Formula (5)

20.3 g (0.1 mole) of p-cyanoethylaminoacetanilide was dissolved in 60 g of N,N-dimethylacetamide dehydrated by azeotropic distillation with benzene, mixed with 18.5 g of polyglycidylether of phenol-formaldehyde condensation resin with an epoxy equivalent of 175 at about 30° C. under stirring, and reacted at 40° to 45° C. for 4 hours and at 60° to 65° C. for 16 hours. The reaction mixture was cooled to about 25° C., nitrogen was passed into the reaction vessel, and 0.1 mole of sodium hydride was added little by little at 10° to 15° C. 10.1 g (0.08 mole) of benzylchloride was added and stirred at 35° to 40° C. for 5 hours. The reaction mixture was cooled to room temperature, and poured into 200 g of 15% aqueous salt solution to deposit, a paste-like reaction product. The paste-like substance was identified by infrared absorption and NMR spectra to have both the groups of Formula (AACNH-G) and Formula (AACNH) (corresponding to a case where $R^1=R^2=H$, $R^3$ is cyanoethyl, and $G^1$ is benzyloxy in both Formulae).

The paste-like reaction product was dissolved in 60 g of acetic acid, mixed with 110 g of 40% sulfuric acid, and stirred under heating at 75° to 80° C. for 8 hours to achieve deacetylation of the acetylamino group and hydrolysis of the cyanoethyl group into carboxyethyl group. After the completion of hydrolysis, 100 g of water was added, cooled to 3° to 5° C., a solution of 7.3 g (0.105 mole) of sodium nitrite in 15 g of water was dropped into the vessel at the same temperature over a period of about one hour, and further stirred for 30 minutes to complete diazotization. The diazotized solution was poured into 400 g of 25% aqueous salt solution at 5° C. under stirring to liberate a paste-like diazo compound. When the diazo compound was separated and kneaded with isopropylalcohol, the diazo compound gradually changed into a powder. The diazo compound powder was filtered, washed twice with isopropylalcohol, and vacuum dried. The yield was 34 g. The aqueous solution of the diazo compound had a $\lambda_{max}$ in the near-ultraviolet absorption spectrum of 374 nm, and an absorption coefficient of 61.2 where the concentration is in g/liter and the optical path length in cm.

Example 3

Synthesis of Photosensitive Polyfunctional Aromatic Diazo Compound of Formula (7)

15.0 g (0.1 mole) of p-aminoacetanilide was dissolved in 70 g of acetic acid, 10.5 g of triglycidylisocyanurate with an epoxy equivalent of 100 was added little by little at 25° to 30° C. with agitation, and the agitation was continued at 25° C. for 8 hours. 9.6 g of glycidylmethylether with an epoxy equivalent of 91 was dropped into the vessel at 25° C., and agitated at 40° C. for 12 hours. Hydrochloric acid, 50 g (35%), was added and agitated at 75° C. for 8 hours to achieve deacetylation. After the reaction, 100 g of water was added and thoroughly agitated, cooled to 3° to 5° C. A solution of 7.6 g (0.11 mole) of sodium nitrite dissolved in 20 g of water was slowly dropped into the vessel at 3° to 5° C. and, thereafter, agitation was continued at the same temperature for one hour to achieve diazotization. The diazotized solution was poured into about 2 liters of isopropylalcohol cooled to 0° C. with agitation, and the precipitated solid was filtered, washed twice with isopropylalcohol, and vacuum dried to obtain 26 g of the aromatic compound described in Example 5 of U.S. Pat. No. 5,206,349.

The diazo compound was dissolved in 100 g of N,N-dimethylacetamide, maintained at 20° to 25° C., 0.5 g of methanesulfonic acid and 11 g of acetic anhydride were dropped into the vessel, agitated at the same temperature, and then dropped into 600-ml of isopropylalcohol. The resulting precipitate was filtered and vacuum dried to obtain 25 g of photosensitive polyfunctional aromatic diazo compound (7).

The chemical structure of the compound was confirmed by way of infrared absorption and NMR spectra. The diazo compound is water-soluble, and the aqueous solution had a $\lambda_{max}$ in the near-ultraviolet spectrum of 374 nm, and an absorption coefficient of 75.1 where the concentration is in g/liter and the optical path length in cm.

Example 4

Synthesis of Photosensitive Polyfunctional Aromatic Diazo Compound of Formula (4)

N-benzylaniline in an amount of 36.7 g (0.2 mole) and 31 g of glycerintriglycidiylether with an epoxy equivalent of 1–15 were dissolved in 350 g of acetic acid, and agitated at 30° C. for 4 hours and at 50° to 60° C. for 8 hours. Hydrochloric acid, 130 g (20%), and 80 g of acetic acid were introduced, cooled to 5° C., and a solution of 15.2 g (0.2 mole) of sodium nitrite in 40 g of water was slowly dropped in at the same temperature over a period of 30 minutes to form a nitroso compound. The reaction mixture was mixed with 120 g of 90% lactic acid, and then with 140 g of 35% hydrochloric acid and 60 g of water. While being maintained at 35° to 40° C. by external cooling, 33 g of zinc powder was slowly added to reduce the nitroso compound, 5 g of activated charcoal was slowly added, thoroughly agitated, and filtered. The filtrate was cooled to 5° C., a solution of 14.5 g (0.21 mole) of sodium nitrite in 40 g of water was slowly dropped into the vessel at the same temperature, thereafter, it was further agitated for 40 minutes; 5 g of activated charcoal was added, thoroughly mixed, and then filtered. While 36 g (0.22 mole) of ammonium hexafluorophosphate was dissolved in 2 kg of water, 30 g of diisopropylether was added, cooled to 5° C., and efficiently agitated. When the diazo compound solution was slowly dropped in, a granular hexafluorophosphate salt of the desired diazo compound was precipitated. The precipitate was washed with ice-cooled water containing isopropylalcohol, and vacuum dried to obtain 72 g of a light yellow powder.

72 g of the diazonium hexafluorophosphate powder was dissolved in 350 g of dehydrated acetone, dissolved in 20 g (0.2 mole) of succinic anhydride and 2 g of methanesulfonic acid, agitated at room temperature (about 20° C.) for 15 hours, dropped into 1 kg of ice-cooled methylenechloride. The precipitated granular substance was filtered, and vacuum dried to obtain 65 g of a yellow-brown powder.

This powder was soluble in 1-methoxy-2-propanol and aqueous sodium carbonate solution. A methylcellosolve solution of the diazo compound had a $\lambda_{max}$ in the near-ultraviolet spectrum of 382 nm, and an absorption coefficient of 56.3 where the concentration is in g/liter and the optical path length in cm.

Example 5

Synthesis of Photosensitive Polyfunctional Aromatic Diazo Compound of Formula (9)

Ethyl p-aminobenzoate in an amount of 6.6 g (0.04 mole) was dissolved in 60 g of acetic acid, 27 g of ethyleneglycoldiglycidylether with an epoxy equivalent of 115 was added at 25° to 30° C., agitated at 25° to 30° C. for one hour and at 60° to 65° C. for 5 hours, 12.0 g (0.08 mole) of p-aminoacetanilide was added, and reacted at 60° to 65° C. for 5 hours with agitation. The mixture was mixed with 40 g of 35% hydrochloric acid, and agitated under heating at 75° to 78° C. for 10 hours to achieve deacetylation of the acetylamino group and hydrolysis of the ethylbenzoate. The reaction mixture was diluted with 70 g of water, cooled to 3° to 5° C., and a solution of 5.9 g (0.085 mole) of sodium nitrite and 10 g of water was dropped in with agitation to achieve diazotization. The diazotized solution was poured with agitation into 400 g of 5% aqueous salt solution at 5° C. to liberate a paste-like diazo compound. The paste-like substance was separated, dissolved in 450 g of cold water, and dropped into a solution of 21.7 g of ammonium hexafluorophosphate and 200 g of water to liberate paste-like diazonium hexafluorophosphate. When the diazo compound was separated and kneaded with diisopropylether, the diazo compound changed into a powder. The powder was filtered, and vacuum dried to obtain 28 g of a diazo compound having a similar structure to the aromatic diazo compound described in Example 9 of U.S. Pat. No. 5,206,349.

The diazonium hexafluorophosphate was dissolved in 150 g of dehydrated acetone, mixed with 7.1 g of acetic anhydride and 0.3 g of methanesulfonic acid, agitated at room temperature (about 20° C.) for 18 hours, and dropped into 400 g of ice-cooled methylenechloride. The precipitated granular substance was filtered and vacuum dried to obtain 24 g of the desired photosensitive polyfunctional aromatic diazo compound of Formula (9). A methylcellosolve solution of the diazo compound had a $\lambda_{max}$ in the UV absorption spectrum of 380 nm, and an absorption coefficient of 30.2 wherein the concentration is in g/liter and the optical path length in cm.

Example 6

Synthesis of Photosensitive Polyfunctional Aromatic Diazo Compound of Formula (8)

p-Aminoacetanilide in an amount of 15.0 g (0.1 mole), 18.2 g (0.1 mole) of ethyleneglycoldiglycidylether with an epoxy equivalent of 115, and 12.0 g of hydroquinonediglycidylether with an epoxy equivalent of 114.7 were dissolved in 50 g of dehydrated N,N-dimethylacetamide and 10 g of N,N-dimethylformamide, agitated at 30° to 35° C. for 3 hours and at 50° to 60° C. for 15 hours, cooled to 20° to 25° C. Maintaining the same temperature, 47 g of thionylchloride was dropped in over a period of one hour, and further agitated at 60° C. for 3 hours. The reaction mixture was poured into a 20% aqueous salt solution cooled to 0° to 5° C. to obtain 55 g of a paste-like substance. The paste-like substance was dissolved in 70 g of acetic acid and 100 g of 10% sulfuric acid, and agitated under heating at 75° to 80° C. for 8 hours to achieve deacetylation of the acetylamino group. After the reaction, 50 g of water and 70 g of 90% lactic acid were added and cooled to 3° to 5° C. A solution of 7.3 g (0.105 mole) of sodium nitrite and 15 g of water was dropped in with agitation at the same temperature over a period of about one hour, and further agitated for 30 minutes to complete diazotization. The diazotized solution was poured into 1 kg of 20% aqueous salt, solution at 5° C. with agitation to precipitate a diazo compound in the form of a powder. The powder was filtered, washed once with 20% aqueous salt solution at 5° C. and then twice with isopropylalcohol, and vacuum dried. The yield was 50 g. An aqueous solution of the diazo compound had a $\lambda_{max}$ in the near-ultraviolet absorption spectrum of 378 nm, and an absorption coefficient of 58.8 wherein the concentration is in g/liter and the optical path length in cm.

Comparative Example 1

Synthesis of Diphenylamine-4-Diazonium Salt/Formaldehyde Condensate 14.5 g (0.05 mole) of diphenylamine-4-diazonium sulfate was dissolved in 50 g of ice-cooled concentrated sulfuric acid, 1.5 g (0.05 mole) of paraformaldehyde was slowly added at 5° to 8° C., and agitated at 8° C. for 2 hours. This mixture was dropped into 200 g of ice-cooled isopropylalcohol at about 5° C. The resulting precipitate was filtered, washed three times with cold isopropyl alcohol, and vacuum dried. The yield was 11 g.

Comparative Example 2

Synthesis of 2-Methoxy-4-Hydroxy-5-Benzoylbenzenesulfonate of Diphenylamine-4-Diazonium Salt/Formaldehyde Condensate Diphenylamine-4-diazonium salt/formaldehyde condensate synthesized in Comparative Example 1 in an amount of 5 g was dissolved in 60 g of ice-cooled 1.5% dilute sulfuric acid, and 6 g of 2-methoxy-4-hydroxy-5-benzoylbenzenesulfonic acid dissolved in 40 g of cold water was poured in with agitation. The resulting precipitate. was filtered, washed three times with cold water, and vacuum dried. The yield was 7.5 g.

Example 7

Photosensitive Lithographic Printing Plate 1 Synthesis of Copolymer (I)

In a 2,000-ml, 4-necked separable flask 300 g of methylcellosolve were placed and heated to 90° C. in a nitrogen stream. Into the flask was dropped a mixture of 162.8 g of acrylonitrile, 89.7 g of methylmethacrylate, 18.0 g of methacrylic acid, 30.0 g of glycerol-monomethacrylate, and 0.60 g of benzoylperoxide over a period of 2 hours. After the completion of dropping, 300 g of methylcellosolve and 0.24 g of benzoylperoxide were dropped in over a period of 30 minutes, and reacted for 5 hours. After the completion of the reaction, the reaction mixture was diluted with 900.0 g of methylcellosolve. The reaction solution was poured into 15 liters of water to precipitate the copolymer. The precipitate was filtered, and vacuum dried at 80° C. to obtain copolymer (I).

A 0.24 mm thick aluminum plate was degreased by immersion for 3 minutes in a 10% trisodium phosphate aqueous solution maintained at 80° C., surface grained with a nylon brush, etched in sodium aluminate at 60° C. for 10 seconds, and desmatted in 3% sodium hydrogen sulfate aqueous solution. This aluminum plate was anodically oxidized in 20% sulfuric acid at 2 A/dm² for 2 minutes, and then treated in 2.5% sodium silicate aqueous solution at 70° C. for 1 minute to obtain an anodized aluminum plate.

The following photosensitive solution (I) was applied to the aluminum plate using a rotary coater. The plate was dried at 100° C. for 2 minutes.

| Composition of photosensitive solution (I) | |
|---|---|
| Diazo compound (4) | 0.30 g |
| (synthesized in Example 4) | |
| Copolymer (I) | 6.0 g |
| Oil Blue #603 (Orient Kagaku Kogyo) | 0.16 g |
| Malic acid | 0.05 g |
| Methylcellosolve | 100 g |

The dry coating amount was 2.0 g/m$^2$. This photosensitive lithographic printing plate was exposed to a 1 kW metal halide lamp at a distance of 70 cm for 40 seconds. Developing solution DN-3C (Fuji Photo Film) was diluted (1:1) with water, and used to develop the photosensitive lithographic printing plate at 25° C. for 1 minute to obtain a lithographic printing plate. This printing plate was used on the 3200 MCD Printing Press (Ryobi) to print high-grade paper to obtain more than 120,000 prints.

Example 8

Photosensitive Lithographic Printing Plate 2

An anodized aluminum plate was prepared using the procedure of Example 7.

The following photosensitive solution (2) was applied to the aluminum plate using a rotary coater. The coated plate was dried at 100° C. for 2 minutes.

| Composition of photosensitive solution (2) | |
|---|---|
| Diazo compound (9) | 0.5 g |
| (synthesized in Example 5) | |
| Copolymer (I) | 6.0 g |
| Oil Blue #603 (Orient Kagaku Kogyo) | 0.16 g |
| Malic acid | 0.16 g |
| Methylcellosolve | 100 g |

The dry coating amount was 2.0 g/m$^2$. This photosensitive lithographic printing plate was exposed to a 1 kW metal halide lamp at a distance of 70 cm for 60 seconds. Developing solution DN-3C (Fuji Photo Film) was diluted (1:1) with water, and used to develop the photosensitive lithographic printing plate at 25° C. for 1 minute to obtain a lithographic printing plate. This printing plate was used on the 3200 MCD Printing Press (Ryobi) to print high-grade paper to obtain more than 120,000 prints.

Comparative Example 3

Comparative Sample of Photosensitive Lithographic Printing Plate

An anodized aluminum plate was prepared using the same procedure of Example 7.

The following comparative photosensitive solution (1) was applied to this aluminum plate using a rotary coater. The coated plate was dried at 100° C. for 2 minutes.

| Composition of comparative photosensitive solution (1) | |
|---|---|
| Comparative diazo compound (2) | |
| 2-methoxy-4-hydroxy-5-benzoylbenzene sulfonate salt of diphenylamine-4-diazonium salt/formaldehyde condensate synthesized in Comparative Example 2 | 0.30 g |
| Copolymer (I) | 6.0 g |
| Oil Blue #603 (Orient Kagaku Kogyo) | 0.16 g |
| Malic acid | 0.05 g |

| Composition of comparative photosensitive solution (1) | |
|---|---|
| Methylcellosolve | 100 g |

The dry coating amount was 2.0 g/m$^2$. This photosensitive lithographic printing plate was exposed to a 1 kW metal halide lamp at a distance of 70 cm for 90 seconds. Developing solution DN-3C (Fuji Photo Film) was diluted (1:1) with water, and used to develop the photosensitive lithographic printing plate at 25° C. for 1 minute to obtain a lithographic printing plate. This printing plate was used on the 3200 MCD Printing Press (Ryobi) to print high-grade paper to obtain more than 100,000 prints.

The photosensitive lithographic printing plates prepared in Examples 7 and 8 and the comparative sample prepared in Comparative Example 3 were exposed by using Kodak Photographic step tablet No. 2 to obtain overall black at step-5 and required exposure times as shown in Table 1. As can be seen from the Table, the inventive photosensitive lithographic printing plates 1 and 2 are higher in sensitivity than the comparative sample.

These three photosensitive lithographic printing plates were stored in an atmosphere at 45° C. and 75% RH to check changes in sensitivity, resolution, and developability. As a result, the samples of Examples 7 and 8 showed no degradation in performance even after storage for 14 days, whereas a substantial degradation in performance was noted for the comparative sample after storage for 7 days.

TABLE 1

| Photosensitive lithographic printing plate | Diazo compound used | Exposure time |
|---|---|---|
| Example 7 | Compound (4) | 40 sec |
| Example 8 | Compound (9) | 60 sec |
| Comparative sample | Comparative compound (2) | 90 sec |

As shown in the table, the photosensitive composition according to the present invention is highly photosensitive, and can be developed rapidly with a weak alkaline developing solution, thereby providing a lithographic printing plate which is good in ink-receptivity, highly resistant to printing and superior in storage stability.

Example 9

Photosensitive Screen Printing Plate

| Composition of photosensitive solution (4) | |
|---|---|
| Diazo compound (8) | 0.35 g |
| (synthesized in Example 6) | |
| Partially-hydrolyzed polyvinylacetate | 10 g |
| (GM-14, Nippon Gosei Kogyo) | |
| Polyvinylacetate emulsion | 40 g |
| (Mowinyl 206, Hoechst Gosei, 50% solid) | |
| Water | 60 g |

A photosensitive solution (4) of the above composition was coated on a 250-mesh monofilament polyester screen on an aluminum frame using a bucket. Coating and air drying at 40° C. for 10 minutes were repeated 4 to 5 times to form a photosensitive film with a thickness of 70 μm (including the screen thickness).

This screen photosensitive plate was exposed with a 4-kW ultra-high pressure mercury lamp (Oak Seisakusho) at a distance of 1 m for 2 minutes. Development was performed as follows: This screen photosensitive plate was immersed in water at 25° C. for 1 minute to dissolve out almost all of the unexposed portions, and sprayed with 20° C. water at a pressure of 6 kg/cm$^2$ with a spray gun from a distance of 30 cm to completely remove residual photosensitive film of the pattern portion.

Using the diphenylamine-4-diazonium salt/formaldehyde condensate synthesized in Comparative Example 1, a comparative sample of photosensitive screen printing plate was prepared using the same procedure as above.

Both plates were compared. As a result, the plate using the diazo compound (8) of the present invention was 4 times higher in photosensitivity and superior in water and solvent resistance. Printing was carried out using the plate. No damage to the pattern was noted, and printing was carried out with consistent printing reproducibility.

Example 10

Colored Image Formation Photosensitive Material

| Formulation of dyeing photosensitive composition | |
|---|---|
| N-vinyl-2-pyrrolidone/2-methacryloxyethyl-trimethylammonium chloride/methyl-methacrylate copolymer (3:1:1 by weight) | 10 g |
| Diazo compound (8) (synthesized in Example 6) | 1.3 g |
| Water | 100 g |

The above dyeing photosensitive composition was coated on a glass plate with a spin coater to a dry film thickness of 0.80 μm, dried at 140° C. for 30 minutes, exposed to ultraviolet light, and measured for the transmittance at 400 nm. Furthermore, after the film was heated in an oven at 200° C. for one hour, the transmittance at 400 nm was again measured. As a reference example, the same measurement was made using the diphenylamine-4-diazonium salt/formaldehyde condensate in place of the above diazo compound. The results are shown in Table 2.

TABLE 2

| | Transmittance at 400 nm | |
|---|---|---|
| | After exposure | After exposure and heating |
| Example 10 | 98.2% | 96.0% |
| Reference Example | 95.2% | 84.9% |

As shown in the Table, the photosensitive composition of the present invention is high in transmittance after exposure and after exposure and heating, and is thus suitable for use as colored image formation photosensitive materials for color filters, color proof, and the like.

Example 11

Colored Image Formation Type Photosensitive Material (Photosensitive Film to Obtain Colored Image)

| Composition of intermediate layer formation solution | |
|---|---|
| Vinylchloride-vinylidenechloride copolymer (40% solution) (Kureha Kagaku, Kurehalon SOA) | 10.0 g |
| Toluene | 45.0 g |
| Ethyl acetate | 45.0 g |
| Composition of colored layer formation solution | |
| Diazo compound (5) 10% aqueous solution (synthesized in Example 2) | 9.0 g |
| Polyvinylalcohol (average polymerization degree: 1700, 88% hydrolysis) | 100.0 g |
| Pigment dispersion (Phthalocyanine Blue 20% solution) | 4.0 g |
| Water | 100.0 g |
| Isopropyl alcohol | 10.0 g |

The above intermediate layer formation solution was coated with a bar coater on one side of a 100 μm thick biaxially oriented polyethyleneterephthalate film, and dried at 100° C. for 1 minute to form an intermediate layer of approximately 1 μm in thickness. On top of the intermediate layer, the colored layer formation solution was coated with a bar coater so that the coating film thickness after drying is 3 μm, and dried in a 80° C. air dryer for 1 minute to obtain cyan-colored film-I.

The colored photosensitive surface of the film-I was closely contacted by a negative original (color-divided network negative—for cyan-colored plate), and exposed by a 1-kW metal halide lamp from a distance of 70 cm for 2 minutes. The non-image portion was washed out by spraying with water at room temperature from a nozzle under a pressure of 1 kg/cm$^2$, the water was removed, and the plate was hot air dried at 50° C. to obtain a cyan-colored positive image.

The cyan-colored positive image of the diazo compound according to the present invention exhibited pure tints of the coloring agent, because residual substance after photodegradation is less colored than that obtained using the diazo compound of Comparative Example 1 (diphenylamine-4-diazonium salt/formaldehyde condensate).

As described above in detail with reference to the examples, the present invention provides the following:

1) A photosensitive polyfunctional diazo compound, which can be handled under visible light free from ultraviolet.
2) A photosensitive polyfunctional diazo compound which has a high solubility in organic solvents, is adequate as a photosensitive material for lithographic printing plates, and can be easily developed with an aqueous alkaline developing solution.
3) A photosensitive polyfunctional diazo compound which has a high solubility in water, and is appropriate for use as a photosensitive agent for screen printing plates.
4) A photosensitive polyfunctional diazo compound which has a high photosensitivity.
5) A photosensitive polyfunctional diazo compound which is high in transmittance after exposure and after exposure and heating.
6) A photosensitive composition utilizing the photosensitive polyfunctional diazo compound having the above properties.

What is claimed is:

1. A photosensitive polyfunctional aromatic diazo compound selected from the group consisting of Formula (I) and Formula (II):

Formula (I)

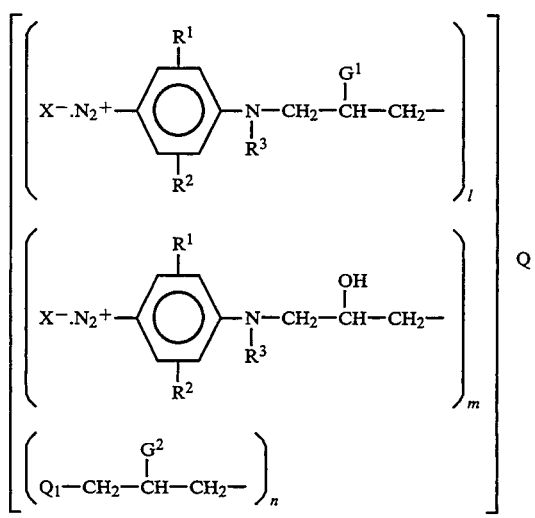

Formula (II)

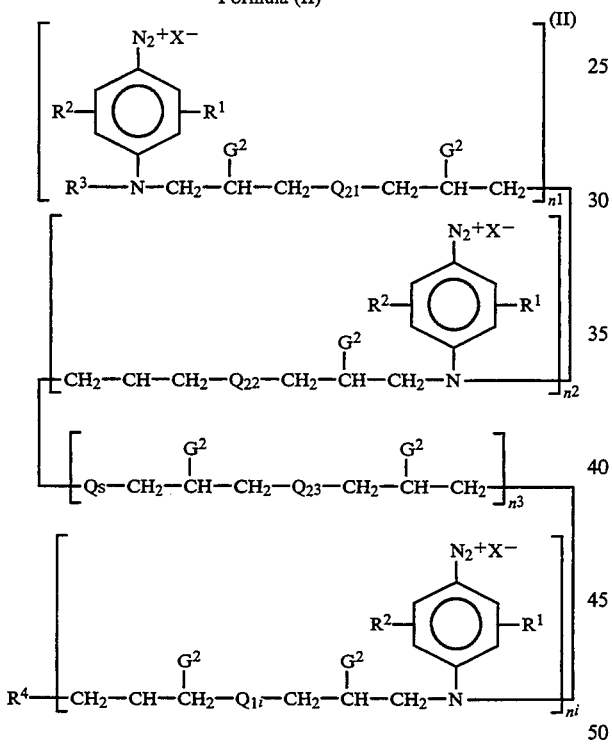

wherein l, m, and n are integers, l=2 to 10, m=0 to 5, n=0 to 5, and l+m+n=2 to 20; $n^1$ to $n^i$ are integers from 0 to 10, $n^1+n^2+n^3+ \ldots +n^i=2$ to 20;

X⁻ is an anion selected from the group consisting of chloride, bromide, sulfate, hydrogensulfate, phosphate, phosphite, tetrafluoroborate, hexafluorophosphate, chloride-zinc chloride, trifluoroacetate, oxalate, alkylsulfonate having 1 to 8 carbon atoms, trifluoromethane sulfonate, arylsulfonate having 6 to 24 carbon atoms, and 2-hydroxy-4-methoxybenzophenone-5-sulfonate;

$G^1$ is selected from the group consisting of chlorine, methoxy, ethoxy, propoxy, butoxy, octyloxy, benzyloxy, phenethyloxy, methylbenzyloxy, carboxymethyloxy, carboxyethyloxy, carboxypropyloxy, methoxymethyloxy, 2-tetrahydropyranyloxy, allyloxy, crotyloxy, sulfoethyloxy, sulfopropyloxy, acetoxy, propionyloxy, butyryloxy, hexanoyloxy, chloroacetyloxy, oxaloxy, carboxyethylcarbonyloxy, carboxypropylcarbonyloxy, and N-phenylcarbamoyloxy;

$G^2$ is selected from the group consisting of hydroxyl group and the same as $G^1$, provided, however, that the number of hydroxyl groups represented by $G^2$ in the diazo compound of Formula (II) is 0 to 10, and the number of the same groups as $G^1$ is 2 to 20;

Q is a polyvalent group derived from the following compounds from which (l+m+n) hydrogen atoms are removed by reacting with (l+m+n) molecules of epichlorohydrin: compounds selected from the group consisting of ammonia, primary alkylamines having 1 to 20 carbon atoms, primary aralkylamines having 7 to 20 carbon atoms, polyamines of 4 to 30 carbon atoms having two or more secondary amino groups in the molecule, dihalogenoaniline, trihalogenoaniline, trialkylaniline, 4,4'-diaminodiphenylsulfone, aniline-formaldehyde condensate, ethanolamine, diethanolamine, glycine, β-alanine, 6-aminohexanoic acid, p-aminobenzoic acid, anthranilic acid, sulfanilic acid, taurine, ethylenediamine, xylylenediamine, ethyleneurea, hydantoin, isocyanuric acid; ethylene glycol, propylene glycol, butylene glycol, xylylene glycol, glycerin, sorbitol, sorbitan, pentaerythritol, tris(2-hydroxyethyl) isocyanurate; 4,4'-dihydroxydiphenylmethane, bisphenol A, tetrabromobisphenol A, bis(4-hydroxyphenyl)acetic acid, 2,2-bis(4-hydroxyphenyl)propionic acid, 4,4'-dihydroxydiphenyl ether, 4,4'-dihydroxydiphenyl sulfone, 1,1,2,2-tetra(4-hydroxyphenyl)ethane, phenol-novolak resin, cresol-novolak resin, catechol, resorcinol, hydroquinone, pyrogallol, gallic acid, dihydroxynaphthalene; dimercaptoalkanes having 2 to 18 carbon atoms, dimercaptoaralkanes having 8 to 20 carbon atoms, dimercaptoethers having 4 to 20 carbon atoms, dimercaptobenzene; dialkyl malonate, N,N'-diacetoacetylalkylenediamine, N,N'-diacetoacetylarylenediamine, N,N'-diacetoacetylaralkylenediamine, diethylenetriamine, triethylenetetramine; aminophenol, hydroxythiophenol, aminothiophenol, and N-acetoacetylthiophenol;

$Q_1$ is a monovalent group derived from the following compounds reacting with one molecule of epichlorohydrin; compounds selected from the group consisting of secondary amines of 2 to 30 carbon atoms having the same or two different alkyls, aralkyls, or aryls, N-methyltaurine, N-methylanthranilic acid, and N-ethylsulfanilic acid; alkyl alcohols having 1 to 20 carbon atoms, aralkyl alcohols having 7 to 30 carbon atoms, phenol and alkyl phenols, p-hydroxybenzoic acid, salicylic acid, and hydroxybenzenesulfonic acid; alkyl or aralkyl mercaptans having 1 to 30 carbon atoms, thiophenol and alkyl thiophenol; 2-mercaptoethanesulfonic acid, mercaptoacetic acid, mercaptopropionic acid, mercaptosuccinic acid, and mercaptobenzoic acid; alkylcyanoacetate, dialkyl esters of alkylmalonic acid, acetoacetylarylamide, hydrogen halides, phosphonic acid, phosphinic acid, and thiosulfate;

$Q_2^1$ to $Q_2^i$ and $Q_s$ are divalent groups derived from the following compounds reacting with two molecules of epichlorohydrin: Compounds selected from the group consisting of primary alkylamines having 1 to 12 carbon atoms, aralkylamines having 7 to 20 carbon atoms, dihalogenoanilines, trihalogenoanilines, trialkylanilines, ethanolamines, glycine, β-alanine, 6-aminohexanoic acid, p-aminobenzoic acid, anthranilic acid, sulfanilic acid, taurine, ethyleneurea, hydantoin, alkylene glycols, aralkylene glycols, 4,4'-dihydroxydiphenylmethane, bis(4-hydroxyphenyl)acetic acid, 2,2-bis(4-hydroxyphenyl)propionic acid, bisphenol A, tetrabromobisphenol A, 4,4'-dihydroxydiphenyl ether, 4,4'-dihydroxydiphenyl sulfone, catechol, resorcinol, hydroquinone, dihydroxynaphthalenes; dimercaptoalkanes having 2 to 12 carbon atoms, dimercaptoaralkanes having 8 to 20 carbon atoms, dimercapto ethers having 4 to 20 carbon atoms, dimercaptobenzene; dialkyl malonates, N,N'-diacetoacetylalkylenediamines, N,N'-diacetoacetylarylenediamines, N,N'-diacetoacetylaralkylene-diamines, N-alkylaminophenols, hydroxythiophenol, N-alkylaminothiophenols, and N-acetoacetylthiophenol;

$R^1$ and $R^2$ are each selected from the group consisting of hydrogen, alkyl having 1 to 8 carbon atoms and alkoxy having 1 to 8 carbon atoms;

$R^3$ is selected from the group consisting of alkyl or substituted alkyl having 1 to 8 carbon atoms, aralkyl or substituted aralkyl having 7 to 14 carbon atoms, and $Q_1$—$CH_2$—$CHG^2$—$CH_2$—;

$R^4$ is selected from the group consisting of $Q_1$ and $G^2$, or is the following group:

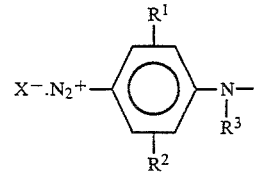

wherein $X^-$, $R^1$, $R^2$, and $R^3$ denote the same groups as above.

* * * * *